(19) United States Patent
Clark et al.

[11] Patent Number: 4,484,338
[45] Date of Patent: Nov. 20, 1984

[54] DATA TRANSMISSION SYSTEMS

[75] Inventors: Adrian P. Clark; Michael J. Fairfield, both of Loughborough, England

[73] Assignee: Plessey Overseas Limited, Ilford, England

[21] Appl. No.: 314,974

[22] Filed: Oct. 26, 1981

[30] Foreign Application Priority Data

Oct. 28, 1980 [GB] United Kingdom ................. 8034682

[51] Int. Cl.$^3$ .............................................. H03D 1/00
[52] U.S. Cl. ........................................ 375/94; 371/43
[58] Field of Search ............................ 370/19, 21, 70; 364/480, 481, 486, 487, 514, 724; 375/12, 14, 16, 94, 96, 99; 371/43-46

[56] References Cited

U.S. PATENT DOCUMENTS

| | | | |
|---|---|---|---|
| 4,130,818 | 12/1978 | Snyder, Jr. ............................ | 371/43 |
| 4,171,516 | 10/1979 | Challen et al. ........................ | 375/88 |
| 4,240,156 | 12/1980 | Doland ................................. | 371/43 |
| 4,293,953 | 10/1981 | Gutleber ............................... | 375/96 |

OTHER PUBLICATIONS

A Reduced State Variant of Maximum Likelihood Sequence Detection Attaining Optimum Performance for High Signal-to-Noise Ratios; Foschini; IEEE Transactions on Information Theory; vol. IT-23, No. 5, Sep. 1977; pp. 605-609.
Near-Maximum-Likelihood Detection Processes for Distorted Digital Signals; Clark et al.; The Radio and Electronic Engineer; vol. 48, No. 6, pp. 301-309, Jun. 1978.
Detection Processes for Severely Distorted Digital Signals; Clark et al.; Electronics Circuits and Systems, Jan. 1979, vol. 3, No. 1, pp. 27-37.
Adaptive Maximum-Likelihood Sequence Estimation for Digital Signaling in the Presence of Intersymbol Interference; Magee, Jr. et al.; IEEE Transactions on Information Theory, Jan. 1973; pp. 120-124.
Estimation of the Sampled Impulse-Response of a Channel; Clark et al.; Signal Processing 2 (1980), pp. 39-53; North Holland Publishing Company.
Detection of Distorted q.a.m. Signals; Clark et al., Electronic Circuits and Systems, Apr. 1977, vol. 1, No. 3, pp. 103-109.
Clark, A. P., "Principles of Digital Data Transmission" Pentech Press, London 1976, pp. 223-359, (Reference 1).
Clark, A. P., "Advanced Data-Transmission Systems" Pentech Press, London 1977, pp. 47-85, (Reference 5).
Feedback Equalization for Fading Dispersive Channels; Monsen; IEEE Transactions on Information Theory, Jan. 1971, pp. 56-64.
An Experimental Adaptively Equalized Modem for Data Transmission over the Switched Telephone Network; The Radio and Electronic Engineer; vol. 42, No. 11, Nov. 1972, pp. 499-507.
Linear and Non-Linear Transversal Equalizers for Baseband Channels; Clark et al., The Radio and Electronic Engineer, vol. 45, No. 6, Jun. 1975, pp. 271-283.
Maximum-Likelihood Sequence Estimation of Digital Sequences in the Presence of Intersymbol Interference; Forney, Jr.; IEEE Transactions on Information Theory, vol. IT-18, No. 3, May 1972; pp. 363-378.
The Viterbi Algorithm; Forney, Jr.; Proceedings of the IEEE, vol. 61, No. 3, Mar. 1973; pp. 268-278.
An Adaptive Receiver for Data Transmission over Time-Dispersive Channels; Qureshi et al.; IEEE Transactions on Information Theory, vol. IT-19, No. 4, Jul. 1973; pp. 448-457.

(List continued on next page.)

Primary Examiner—Benedict V. Safourek
Attorney, Agent, or Firm—Fleit, Jacobson, Cohn & Price

[57] ABSTRACT

A method and apparatus for decoding received data signals using a Viterbi algorithm. To reduce the time required to decode a data signal, the system expands k received data vectors into nk vectors where n is smaller than m, m being the number of levels of the received data signal. Thereafter, k vectors are chosen from the nk expanded vectors and a "cost", defined herein is determined for each of said k vectors. The most likely identity of the received data signal is then determined on the basis of the computed costs.

6 Claims, 18 Drawing Figures

OTHER PUBLICATIONS

Adaptive Channel Memory Truncation for Maximum Likelihood Sequence Estimation; Falconer et al.; The Bell System Technical Journal; vol. 52, No. 9, Nov. 1973, pp. 1541–1562.

Further Results on the Viterbi Algorithm Equalizer; Cantoni et al.; IEEE Transactions on Information Theory, Nov. 1974; pp. 764–767.

Optimal Short Desired Impulse Response for Maximum Likelihood Sequence Estimation; Desblache; IEEE Transactions on Communications, Jul. 1977; pp. 735–738.

DATA TRANSMISSION SYSTEMS

The present invention relates to Data Transmission Systems and more particularly to modems for such systems.

The invention is concerned with modems which utilise the Viterbi-algorithm (Forney, G. D. The Viterbi-algorithm, Proc.IEEE, Vol 61, pp268–278, March 1973) as a method of decoding the data signals.

The object of the present invention is to reduce the complexity of a reduced-state Viterbi-algorithm detector operating on a multi-level signal, without significantly degrading its performance, and thereby makes it possible to achieve near maximum-likelihood detection at a cost not very much greater than that involved in a conventional equalizer. The potential advantage in tolerance to additive noise, likely to be gained by the system, is up to about 6 dB.

The basic technique of the invention is to double expand either sequentially or simultaneously the incoming signal thus reducing the complexity of the detector.

More particularly the inventive feature involves the method that is used to select k stored vectors from mk expanded vectors (where m is the number of levels of the data signal) in the algorithm of a reduced-state Viterbi-algorithm detector. On the receipt of a received sample, each stored vector is here "expanded" into m vectors and the "cost" associated with each of these is evaluated. From the mk expanded vectors k vectors are now selected according to some criterion. When m and k are both large, mk becomes very large and an excessive number of operations is required per received sample. The basic feature of the invention is to break the expansion process down into two separate operations, which may be performed sequentially or simultaneously and each of which involves expanding the k stored vectors into nk vectors (where $n < < m$) from which are then selected k stored vectors. When the two expansion processes are performed sequentially, $n \leq m^{\frac{1}{2}}$ and k vectors are selected after each expansion. When the two expansion processes are performed simultaneously, $n \leq m^{\frac{1}{2}}$ and the two sets of nk expanded vectors give an effective total of $n^2k$ vectors from which are selected k stored vectors. Use is made of the fact that the cost of any one of the effective total of $n^2k$ vectors is very simply derived from the costs of the two individual vectors, one in each of the two sets of nk expanded vectors and together giving the resultant vector, so that the amount of computation involved corresponds to 2nk expanded vectors rather than $n^2K$ vectors.

The immediate application of the invention is in a 9600 bits-per-second modem for use over the public switched telephone network. Other applications include digital data-transmission systems in which multi-level signals, at rates of up to 100,000 bits-per-second, are sent over channels introducing severe time dispersion of the transmitted signal-elements, and where it is required to achieve a good tolerance to additive noise.

Embodiments of the present invention will now be described with reference to the accompanying drawings in which: FIG. 1 shows a Data-transmission system according to the present invention, FIG. 2 shows a block diagrammatic circuit for the adaptive adjustment of linear filter and estimator, FIG. 3a shows attenuation characteristic and FIG. 3b shows group-delay characteristic of telephone-circuit 1.

Figure 12A:
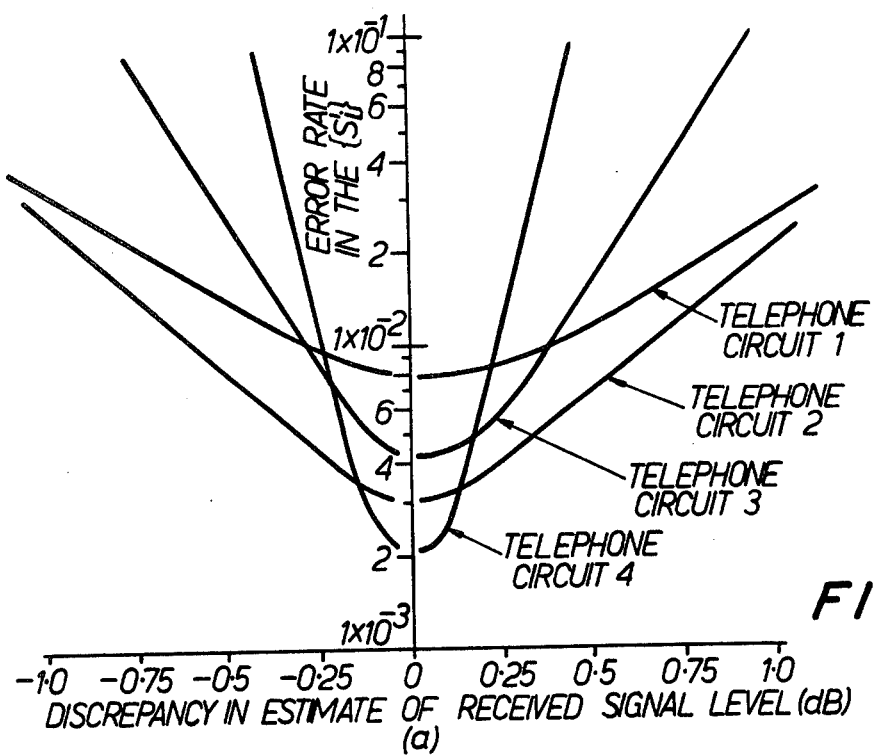
Figure 12B:
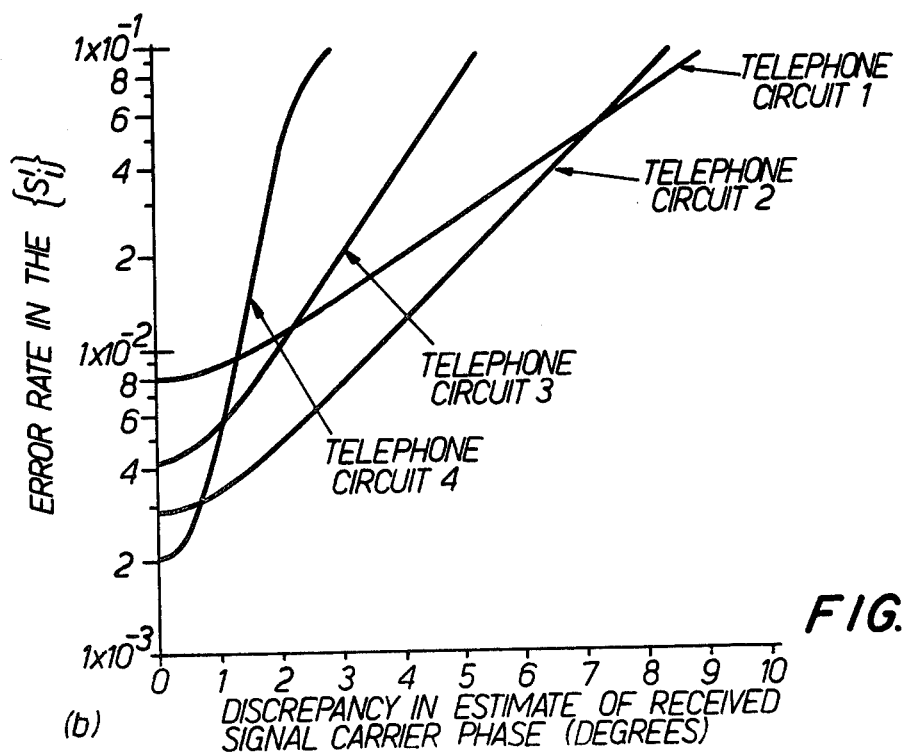

FIG. 12 generally shows variation of error rate with an inaccuracy in the estimate made by the receiver. FIG. 12a shows the level and FIG. 12b shows the carrier phase of the received signal, for the System E with $m=6$ and $n=7$ operating over the telephone-circuits 1–4.

INTRODUCTION

A telephone circuit in the switched telephone network may have any one of a very wide range of attenuation-frequency characteristics and any one of a correspondingly wide range of group-delay frequency characteristics, giving an available (or usable) bandwidth that may lie anywhere in the range from about 1500 Hz to 3000 Hz.[1] It is evident therefore that for the satisfactory transmission of data at a rate as high as 9600 bits/second over the switched telephone network, the receiver must be adaptive in the sense that it takes full account of the distortion introduced into the received data signal. The conventional approach to this problem is to use an adaptive nonlinear (decision-feedback) equalizer that is adjusted to minimize the mean-square error in the equalized signal.[2-5] Such systems are known to operate satisfactorily over telephone circuits at rates of up to 4800 bits/second. At higher transmission rates, however, satisfactory operation is not always obtained over the poorer telephone circuits.

An alternative approach that has recently been considered is the use of the Viterbi-algorithm detector.[5-7] This selects as the detected message the possible sequence of transmitted data-symbols (signal-element values) for which there is the minimum mean-square difference between the samples of the corresponding received data signal, for the given signal distortion but in the absence of noise, and the samples of the signal actually received. When the data signal is received in the presence of stationary additive white Gaussian noise, giving statistically independent Gaussian noise samples at the detector input, this is a process of maximum-likelihood detection, and when the transmitted data-symbols are statistically independent and equally likely to have any of their possible values, the detection process minimizes the probability of error in the detection of the received message.[5] It is assumed here that the received signal is sampled at the Nyquist rate, so that the corresponding samples contain all the information in this signal.

Unfortunately, when the sampled impulse-response of the channel contains a large number of components (non-zero samples), the Viterbi-algorithm involves both an excessive amount of storage and an excessive number of operations per received data symbol. One approach for overcoming this difficulty is to use a linear feedforward transversal filter at the detector input to reduce the number of components in the channel sampled-impulse-response. The filter is adjusted adaptively to give a "desired" sampled impulse-response for the channel and filter, which has a given small number of components and may or may not be fixed.[8-11] The disadvantage of this arrangement is that, for some telephone circuits, the linear filter may equalize some of the amplitude distortion introduced by the telephone circuit and under these conditions maximum-likelihood detection is not longer achieved, leading to an inferior performance.[5] The linear filter should ideally perform the function of a "whitened matched-filter",[6,14] which ensures that true maximum-likelihood detection is achieved by the Viterbi-algorithm detector. In the ideal arrangement and with stationary additive white Gaussian noise at the receiver input, the data signal is transmitted over the channel at the Nyquist rate and the receiver filter has the same bandwidth as the received signal, being such that, with the sampling of the signal at the output of the receiver filter, once per data symbol (at the Nyquist rate), the noise samples at the output of the sampler are statistically independent Gaussian random variables with a fixed variance. The whitened matched-filter now becomes the same as the linear feedforward transversed filter that forms the first part of a conventional nonlinear (decision-feedback) equalizer, where this is fed with the given sampled signal and is adjusted to minimize the meansquare error (and hence maximize the signal/noise ratio) in its output signal, subject to the exact equalization of the channel.[5] The advantage of this is that the linear filter may be held adaptively adjusted for the channel to give approximately the required response, at least at high signal/noise ratios, using basically the same simple arrangement as that involved in a conventional adaptive nonlinear equalizer.[5] The signal at the output of the linear filter is fed to the maximum-likelihood detector, and the feedback filter gives an estimate of the sampled impulse-response of the channel and linear filter, which is required by the detector. The details of the arrangement will be described later. When correctly adjusted, the linear filter is such that, in the z transform of the sampled impulse-response of the channel and linear filter, all zeros (roots) of the z transform of the sampled impulse-response of the channel, that lie outside the unit circle in the z plane (that is, have an absolute value greater than unity), are replaced by the complex conjugates of their reciprocals, all remaining zeros being left unchanged.[5] Thus all zeros of the z transform of the channel and linear filter lie inside or on the unit circle. The linear filter is, in fact, a pure phase equalizer (although not usually for the channel itself) and so performs an orthogonal transformation on the received signal.[5] In practice, the linear filter may introduce some gain or attenuation, which however has the same effect on the noise as on the data signal, and so does not change in any way the statistical relationship between the noise and data signal. This means that a Viterbi-algorithm detector operating at the output of the filter has the same tolerance to the Gaussian noise as the appropriate Viterbi-algorithm detector operating at its input, although generally involving much less complex equipment. Furthermore, when an allowance has been made for the change in level, the noise components at the filter output have the same statistical properties as those at its input, being therefore statistically independent and with a fixed variance. Since the linear filter does not now remove any of the amplitude distortion introduced by the channel, it unfortunately does not always achieve an adequate reduction in the number of components of the resultant sampled impulse-response.

It follows that it is desirable the prior art Viterbi-algorithm detector must be replaced by a near-maximum-likelihood Viterbi-algorithm detector that uses very much less storage and requires far fewer operations per received data-symbol, for the given number of components in the sampled impulse-response of the channel. Various systems of this type have been developed and tested by computer simulation, with very promising results.[5,12,13]

An alternative approach that has recently been studied is to discard the linear filter altogether, so that the near-maximum-likelihood detector operates directly on the original sampled signal, at the output of the sampler.[14] An estimator is, of course, required here to determine the sampled impulse-response of the channel, but this can be implemented relatively simply, requiring a transversal filter with only as many taps as there are components in the sampled impulse-response of the channel.[15,16] However, computer-simulation tests (whose results have not been published) have shown that in the presence of very severe phase distortion, such as can occur over the poorer switched telephone circuits, these systems require a considerable amount of storage and a large number of operations per received data-symbol, in order to achieve near-maximum-likelihood detection. The most cost-effective arrangement for the given application is therefore to use an adaptive linear filter of the type previously described, connected between the sampler and detector and acting as a whitened matched filter. The adaptive filter has the important property that it (at least approximately) removes all the phase distortion introduced by the channel and in addition adjusts the sampled impulse-response of the channel and filter into a form that is ideally suited to a near-maximum-likelihood detector of the type considered here.[5,13]

The specific embodiments described hereinafter with reference to FIGS. 1 through 12 are concerned with an improved detection method and apparatus for QAM (quadrature amplitude modulated) system operating at 9600 bits/second with a 16-point QAM signal. Details are given here of novel detection processes that avoid the high complexity involved with a 16-point signal in the previously described processes. Results of computer-simulation tests are shown in FIGS. 8 through 12, comparing the performances of the various systems, when operating over different telephone circuits.

MODEL OF DATA TRANSMISSION SYSTEM

Figure 1:
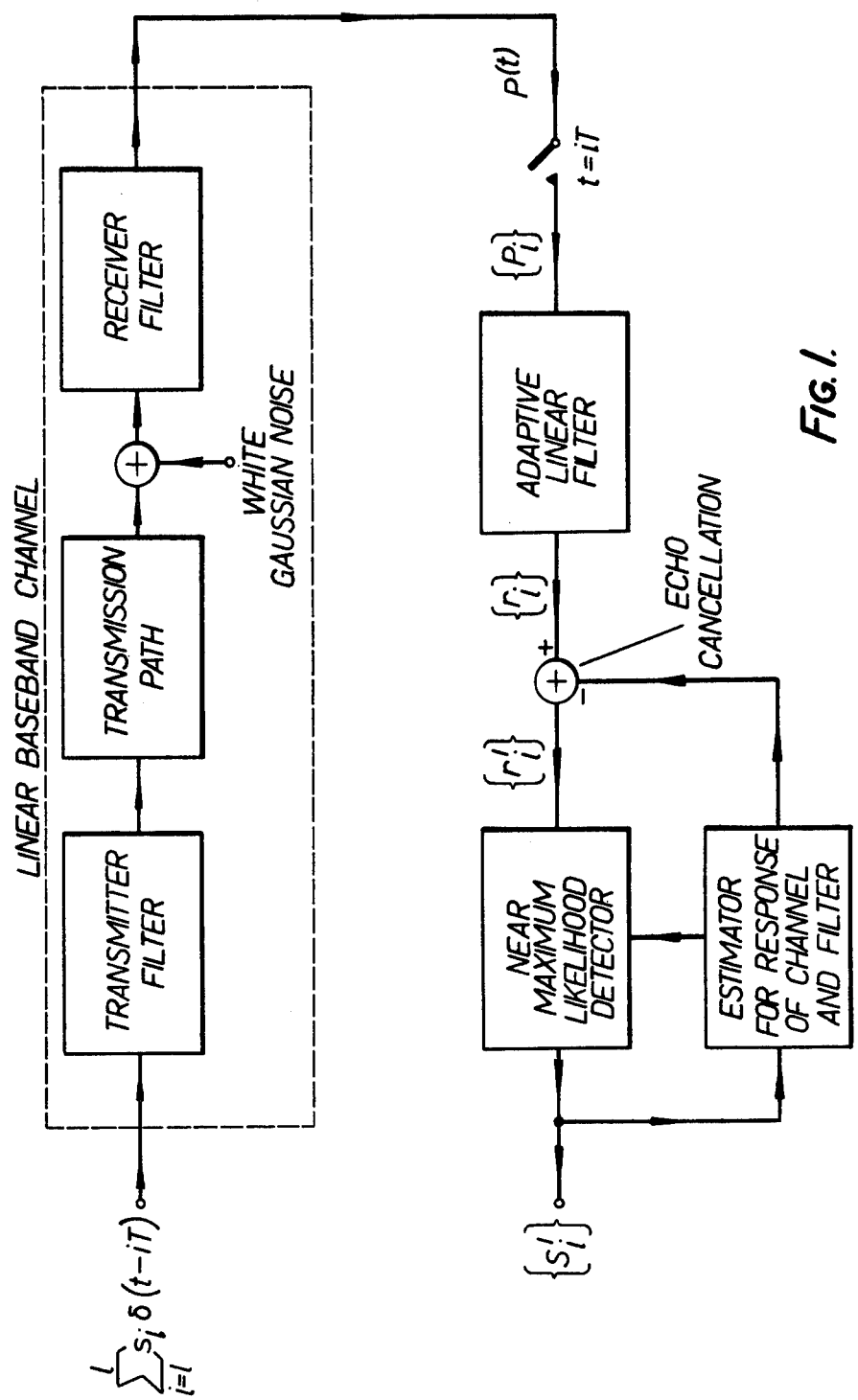

The model of the data-transmission system is shown in FIG. 1. This is a synchronous serial 16-point QAM system. The information to be transmitted is carried by the data-symbols $\{s_i\}$, where $$s_i = \pm a \pm bj$$

and $j=\sqrt{-1}$. $a=1$ or 3 and $b=1$ or 3. The $\{s_i\}$ are statistically independent and equally likely to have any of their 16 possible values. It is assumed that $s_i=0$ for $i \leq 0$, so that $s_i\delta(t-iT)$ is the ith signal-element at the input to the transmitter filter. The transmission path is a linear baseband channel that includes a telephone circuit together with a linear QAM modulator at the transmitter and a linear QAM demodulator at the receiver. The basic structure of the modulator and demodulator has been described elsewhere.[17] The signals transmitted over the "in phase" channel of the QAM system are represented by real-valued quantities, and the signals over the "quadrature" channel by imaginary-valued quantities, to give a resultant complex-valued baseband signal at both the input and output of the transmission path in FIG. 1. The carriers of the transmitted signals in the in-phase and quadrature channels are taken to be $\sqrt{2} \cos 2\pi f_c t$ and $-\sqrt{2} \sin 2\pi f_c t$, respectively, where $f_c = 1800$.[17] The transmitter filter, transmission path and receiver filter together form a linear baseband channel whose impulse response is the complex-valued function $q(t)$, with an effective duration of less than $(g+1)T$ seconds, where $g$ is the appropriate integer. It is assumed for the purpose of this invention that $q(t)$ is time invariant over any one transmission. The various types of additive and multiplicative noise normally introduced by telephone circuits are neglected here, and it is assumed that the only noise is stationary white Gaussian noise with complex values, zero mean and a flat (frequency independent) power spectral density, which is added to the data signal at the output of the transmission path, to give the complex-valued Gaussian noise waveform $v(t)$ at the output of the receiver filter. Although telephone circuits do not normally introduce significant levels of Gaussian noise, the relative tolerance of different data-transmission systems to white Gaussian noise is a good measure of their relative overall tolerance to the additive noise actually experienced over telephone circuits.[1]

The waveform at the output of the receiver filter is the complex-valued signal $$p(t) = \sum_{i=1}^{l} s_i q(t - iT) + v(t) \qquad (1)$$

where $l$ is some large positive integer. The waveform $p(t)$ is sampled once per data symbol at the time instants $\{iT\}$ to give the received samples $\{p_i\}$, which are fed to the adaptive linear filter (FIG. 1). This filter is taken to have been adjusted exactly as previously described so that it acts as a whitened matched filter, the only difference being that the filter now operates with complex-valued samples in place of the real-valued samples previously assumed. Thus the sampled impulse-response of the linear baseband channel and adaptive linear filter (FIG. 1) is given by the $(g+1)$-component vector $$Y = y_0 y_1 \ldots y_g \qquad (2)$$

which has complex-valued components and a z transform with all its zeros inside or on the unit circle in the z plane. Furthermore, when an allowance has been made for the change in level, the noise components $\{w_i\}$ at the output of the filter have the same statistical properties as the noise components $\{v_i\}$ at its input, where $v_i = v(iT)$. The delay in transmission over the baseband channel and adaptive filter, other than that involved in the time-dispersion of the received signal, is for convenience neglected here, so that $y_0 \neq 0$ and $y_i = 0$ for $i<0$ and $i>g$. Thus the sample value at the filter output, at time $t=iT$, is the complex-valued quantity $$r_i = \sum_{h=0}^{g} s_{i-h} y_h + w_i \qquad (3)$$

where the real and imaginary parts of the $\{w_i\}$ are statistically independent Gaussian random variables with zero mean and variance $\sigma^2$.

Figure 2:
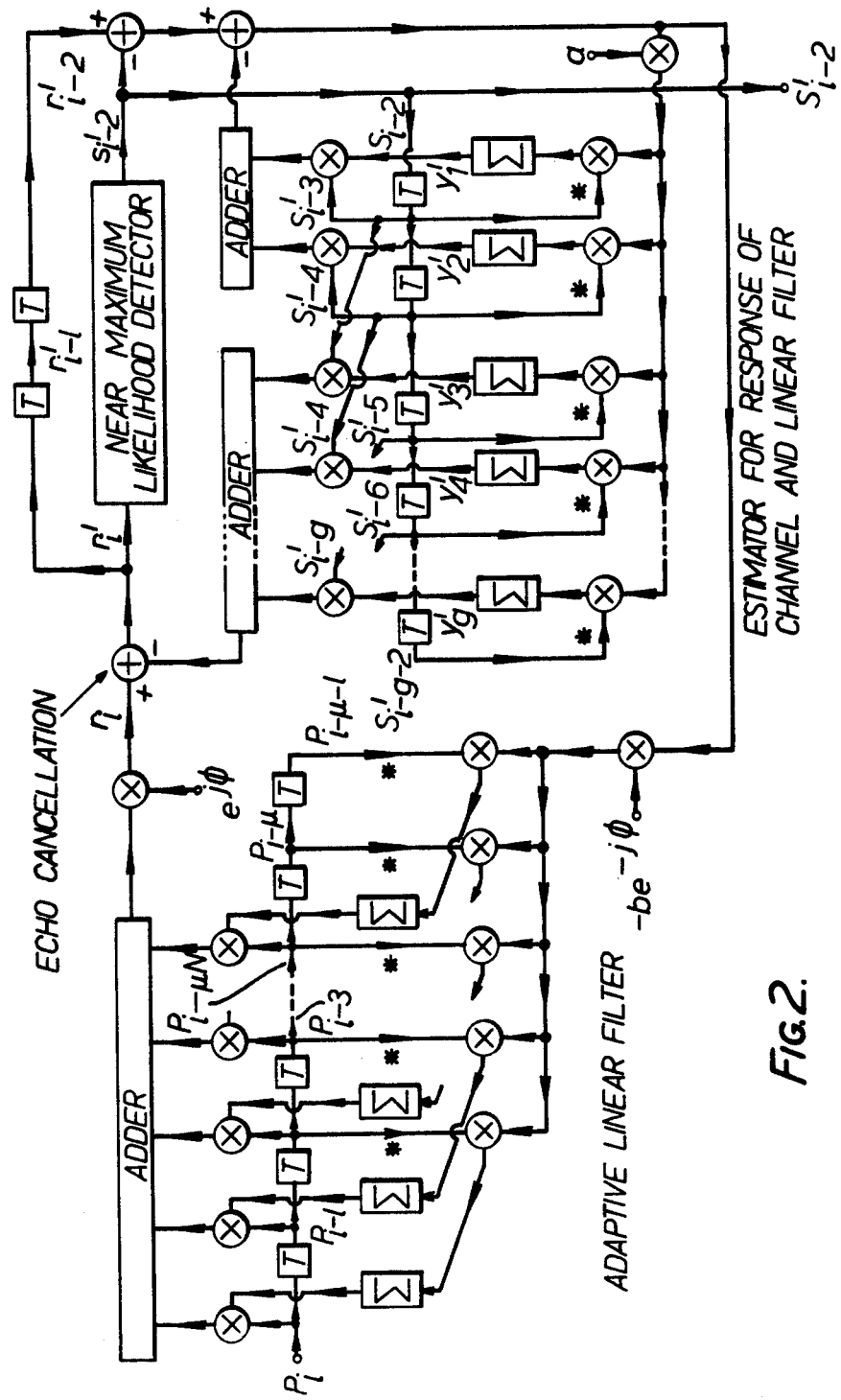
Figure 3A:
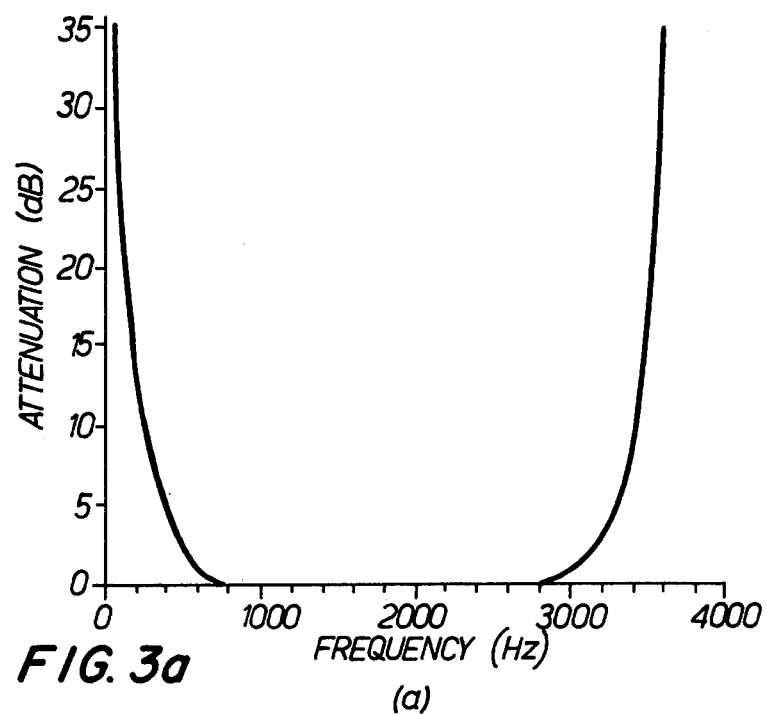
Figure 3B:
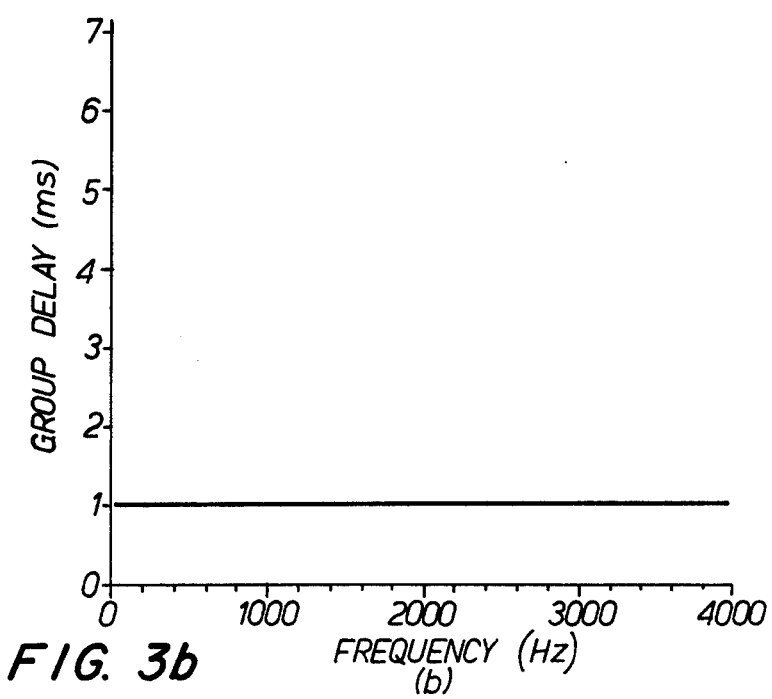
Figure 4A:
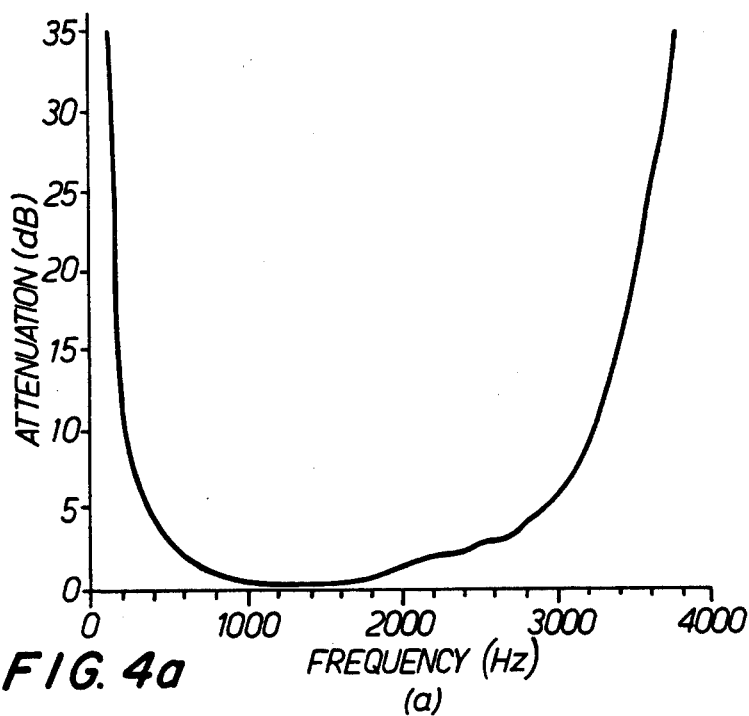
FIG. 4a shows attenuation characteristic and FIG. 4b shows Group-delay characteristic of telephone-circuit 2.
Figure 4B:
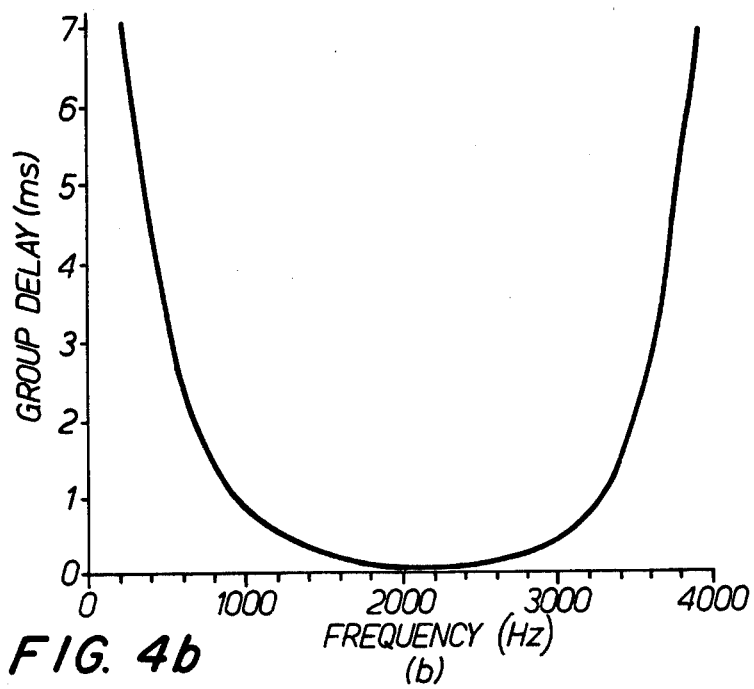
Figure 5A:
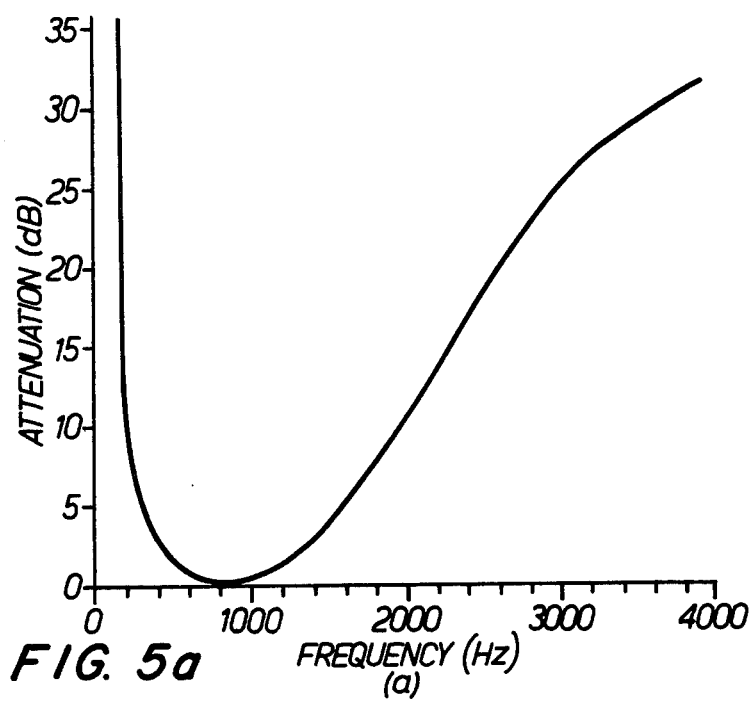
FIG. 5a shows attenuation characteristic and FIG. 5b shows Group-delay characteristic of telephone-circuit 3.
Figure 5B:
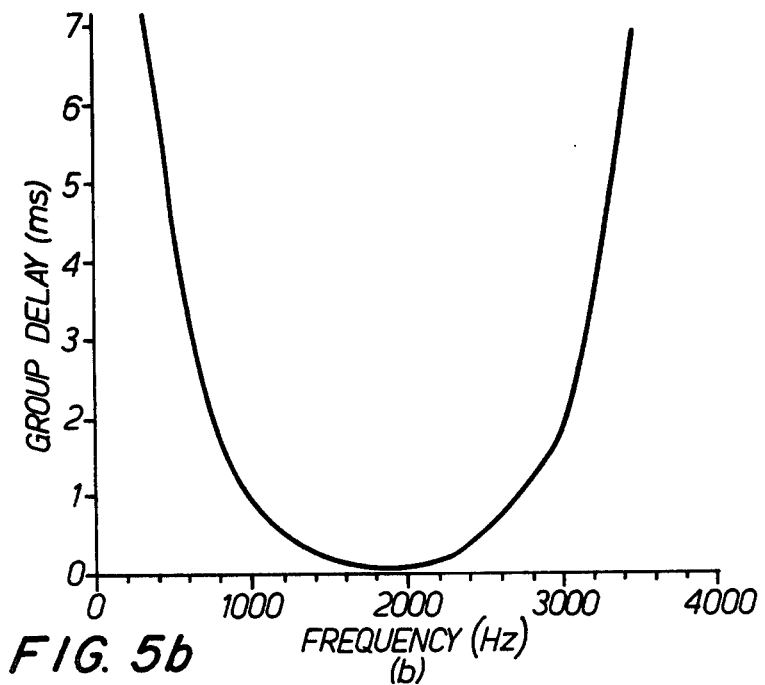
Figure 6A:
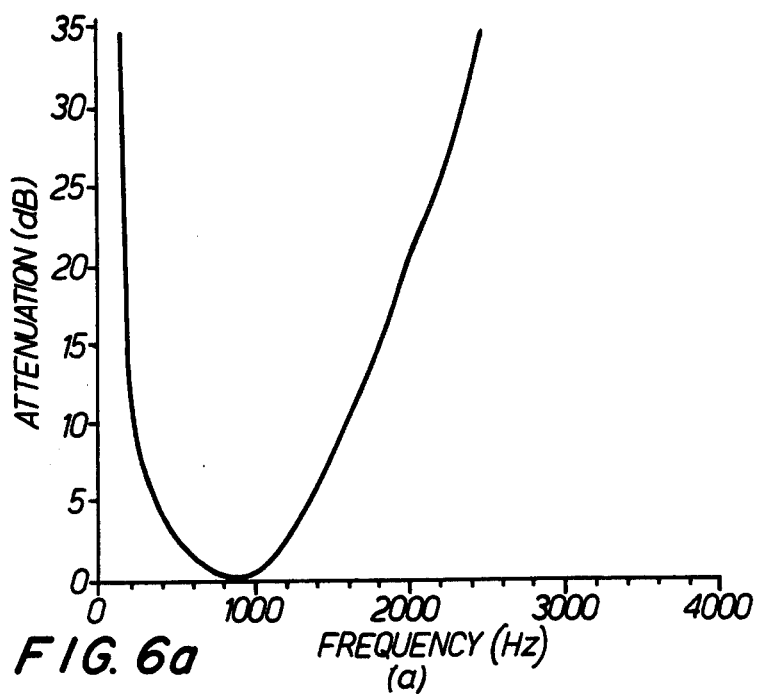
FIG. 6a shows attenuation characteristic and FIG. 6b shows Group-delay characteristic of telephone-circuit 4.
Figure 6B:
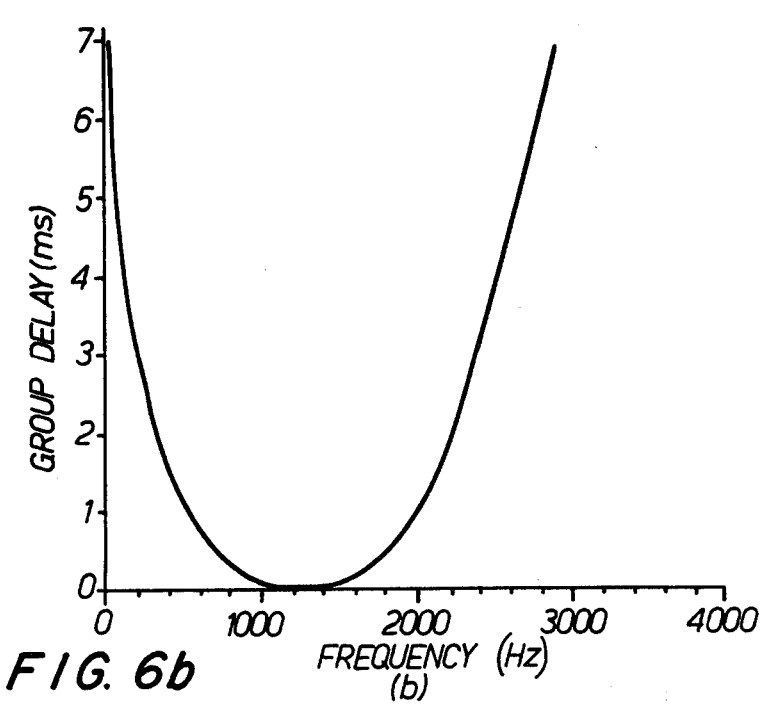

The adjustment of the adaptive linear filter and the estimation of Y is achieved by the arrangement shown in FIG. 2. It can be seen that this is a simple development of a conventional adaptive nonlinear (decision-feedback) equalizer for the case where there is a delay in detection (of two sampling intervals in this particular example).[5] Clearly, when there is no delay in detection, the arrangement degenerates into a conventional equalizer. The main tap of the $\mu$-tap adaptive linear feedforward transversal filter, is close to the last tap, for all channels. A square marked T is a store that holds the corresponding sample value, the stored values being shifted one place in the direction shown during each sampling interval. A square marked $\Sigma$ is an accumulator that sums the input samples, and * indicates that the corresponding sample value is replaced by its complex conjugate. a and b are small positive constants, and $\phi$ radians is the carrier phase correction necessitated by a phase error in the coherent demodulator. $\phi$ is determined by the carrier phase control circuit, which is not shown in FIGS. 1 and 2. The adaptive adjustment of $\phi$, together with that of the transversal-filter tap-gains in FIG. 2, is arranged to be such that $y_o = 1$, and the method of adjustment of each transversal filter is the same as that in a conventional equalizer.[5]

Except where otherwise stated it will be assumed that the adaptive linear filter is correctly adjusted and that the estimate of Y, which is the sequence $y_o', y_1', \ldots, y_g'$ stored in the channel estimator, is also correct. The estimate of Y, together with a prior knowledge of the possible values of $s_i$, are used by the near-maximum-likelihood detector and echo canceller.

The detector (FIG. 1) operates on its input samples $\{r_i'\}$ to give the finally detected data-symbols $\{s_i'\}$, $s_i'$ being determined after the receipt of $r_{i+n}'$, where $n<g$, so that there is a delay in detection of n sampling intervals. The echo canceller removes from the samples $\{r_i\}$ estimates (detected values) of all components involving data symbols $\{s_i\}$ whose final detected values $\{s_i'\}$ have already been determined. Thus the echo canceller operates on $r_i$ to give $$r_i' = r_i - \sum_{h=n+1}^{g} s_{i-h}' y_h \qquad (4)$$

When $s_{i-h}' = s_{i-h}$, for all $\{h\}$, as will be assumed for the present, $$r_i' = \sum_{h=0}^{n} s_{i-h} y_h + w_i \qquad (5)$$

so that the sampled impulse-response of the channel and adaptive filter has been reduced from $g+1$ to $n+1$ components, thus greatly simplifying the detection process when $n<<g$.

Let $S_k$, $R_k'$ and $W_k$ be the k-component row vectors whose ith components are $s_i$, $r_i'$ and $w_i$, respectively, for $i = 1, 2, \ldots, k$. Also let $X_k$, $Z_k$ and $U_k$ be the k-component row-vectors whose ith components are $x_i$, $z_i$ and $u_i$, respectively, for $i = 1, 2, \ldots, k$, where $x_i$ has one of the 16 possible values of $s_i$, $$z_i = \sum_{h=0}^{n} x_{i-h} y_h \quad (6)$$

and $u_i$ is the possible value of $w_i$ satisfying $$r_i' = z_i + u_i \quad (7)$$

In the k-dimensional complex vector space containing the vectors $R_k'$, $Z_k$ and $U_k$, the square of the "unitary" distance between the vectors $R_k'$ and $Z_k$ is $$|U_k|^2 = |u_1|^2 + |u_2|^2 + \ldots + |u_k|^2 \quad (8)$$

where $|u_i|$ is the absolute value(modulus) of $u_i$. The cost of a stored vector (sequence) is the square of the unitary distance between the sequence of received samples at the detector input and the sequence of samples that would have been received had the transmitted data symbols been given by the stored vector and had there been no noise. The square of the unitary distance is the sum of the squares of the real and imaginary parts of the difference sequence formed by subtracting on of the above sequences from the other. It is to be recognized that some persons in this field utilize the word "metric" rather than the word "cost" as defined herein.

When all real and imaginary components of the $\{w_i\}$ are statistically independent and with a fixed variance, the maximum-likelihood vector $X_k$ is its possible value such that $|U_k|^2$ is minimized. Under the assumed conditions this $X_k$ is the possible value of $S_k$ most likely to be correct.

Systems A, B, C, D, E and F will now be described to illustrate the present invention.

SYSTEM A

With reference to FIG. 2 just prior to the receipt of the sample $r_k$ at the detector input, the detector holds in store m n-component vectors $\{Q_{k-1}\}$, where m is a multiple of 4, $$Q_{k-1} = x_{k-n} x_{k-n+1} \cdots x_{k-1} \quad (9)$$

and $x_i$ is as previously defined. Each vector $Q_{k-1}$ is associated with the corresponding cost $|U_{k-1}|^2$ (eqn.8), in the evaluation of which it is assumed that $s_i' = s_i$ for every i. This implies that the echo canceller operates in the ideal manner and means, of course, that there is an inaccuracy in $|U_{k-1}|^2$ whenever one or more of the $\{s_i'\}$ are incorrect.

On the receipt of $r_k'$, each of the stored vectors $\{Q_{k-1}\}$ is expanded into four (n+1)-component vectors $\{P_k\}$, where $$P_k = x_{k-n} x_{k-n+1} \cdots x_k \quad (10)$$

The first n components of $P_k$ are as in the original vector $Q_{k-1}$ and the last component $x_k$ has the four different values $\pm 2 \pm 2j$. The cost associated with each vector $P_k$ is evaluated as $$c_k = |U_{k-1}|^2 + \left| r_k' - \sum_{h=0}^{n} x_{k-h} y_h \right|^2 \quad (11)$$

For each of the four possible values of $x_k$, the detector then selects the $\frac{1}{4}m$ vectors $\{P_k\}$ having the smallest costs $\{c_k\}$, to give a total of m selected vectors together with their associated costs. Each selected vector $P_k$ is next expanded into four vectors $\{P_k\}$ where the first n components are again as in the original vector $Q_{k-1}$, and to the given value of the last component $x_k$ (now $\pm 2 \pm 2j$) are added the four different values $\pm 1 \pm j$. The cost associated with each expanded vector is evaluated as $$|U_k|^2 = |U_{k-1}|^2 + \left| r_k' - \sum_{h=0}^{n} x_{k-h} y_h \right|^2 \quad (12)$$

The detected data-symbol $s_{k-n}'$ is then taken as the value of $x_{k-n}$ in the vector $P_k$ with the smallest cost, and the first symbol $x_{k-n}$ in each vector $P_k$ is discarded to give the corresponding vector $Q_k$, which is, of course, associated with the same cost $|U_k|^2$. Finally, m vectors $\{Q_k\}$ are selected from the 4 m vectors $\{Q_k\}$, as follows. When m = 32, the detector selects, for each of the 16 possible values of $x_k$, the two vectors $\{Q_k\}$ that have the smallest costs and differ in the value of $x_{k-1}$. When m = 16, the detector selects, for each of the 16 possible values of $x_k$, the vector $Q_k$ having the smallest cost. The selected vectors are now stored together with their associated costs. These arrangements can be implemented simply and ensure that all selected vectors are different, thus preventing any "merging" of the stored vectors.[13]

The technique just described in an arrangement of "double expansion" in which it is assumed that $$x_k = x_{a,k} + x_{b,k} \quad (13)$$

where $x_{a,k} = \pm 2 \pm 2j \quad (14)$ and $x_{b,k} = \pm 1 \pm j \quad (15)$ so that $x_k$ is treated as the sum of two separate 4-level data-symbols $x_{a,k}$ and $x_{b,k}$. In the expansion of the m stored vectors $\{Q_{k-1}\}$, $x_{b,k}$ is set to zero so that $x_k$ is treated as though it were $x_{a,k}$. In the expansion of the m selected vectors $\{P_k\}$, $x_k$ is taken as $x_{a,k} + x_{b,k}$, the value of $x_{a,k}$ for each vector being, of course, that determined in the first process of expansion and selection.

The arrangement relies on the fact that if some complex number $q_k$ is at a smaller unitary distance from a given one of the 4 possible values of $x_{a,k}$ than from the 3 remaining possible values of $x_{a,k}$, then it is also at a smaller unitary distance from $x_{a,k} + x_{b,k}$, for the given $x_{a,k}$ and for any of the 4 possible values of $x_{b,k}$, than it is from the remaining 12 possible values of $x_{a,k} + x_{b,k}$. This implies that the possible value of $x_k$ closest to $q_k$ may be determined in two successive operations: first the selection of the possible value of $x_{a,k}$ closest to $q_k$, and then, for the selected value of $x_{a,k}$, the determination of the possible value of $x_{b,k}$ such that $x_{a,k} + x_{b,k}$ is closest to $q_k$.

SYSTEM B

In FIG. 2 just prior to the receipt of the sample $r_k'$ at the detector input, the detector holds in store m n-component vectors $\{Q_{k-1}\}$ together with the associated costs $\{|U_{k-1}|^2\}$ (eqns. 9 and 12). On the receipt of $r_k'$ the detector expands each vector $Q_{k-1}$ into the corresponding 16 vectors $\{P_k\}$ (eqn. 10) having the 16 possible values of $x_k$ (given by $\pm a \pm bj$, for $a=1$ or 3 and $b=1$ or 3) and it evaluates the cost $|U_k|^2$ for each of the 16 vectors $\{P_k\}$. It then selects the vector $P_k$ with the smallest cost and takes the detected data-symbol $s_{k-n}'$ to have the value of $x_{k-n}$ in the selected vector $P_k$. All vectors $\{P_k\}$ for which $x_{k-n} \neq s_{k-n}'$ are now discarded, and the first component of each of the remaining vectors $\{P_k\}$ is omitted to give the corresponding n-component vectors $\{Q_k\}$. The one of these vectors derived from the vector $P_k$ with the smallest cost $|U_k|^2$ is the first selected vector $Q_k$. The detector then selects from the remaining vectors $\{Q_k\}$ the $m-1$ vectors associated with the smallest costs, to give a total of m vectors $\{Q_k\}$ and their associated costs, which are stored. The discarding of the given vectors $\{P_k\}$ prevents the merging of the stored vectors, since it ensures that, if these are all different at the start of transmission, no two or more of them can subsequently become the same.

SYSTEM C

The technique of double expansion, applied in System A, is here applied to System B, to give an arrangement involving less storage and a smaller number of operations in a detection process than does System B. Following the expansion of the m stored vectors $\{Q_{k-1}\}$ into 4 m vectors $\{P_k\}$, for which $x_k = \pm 2 \pm 2j$, and the evaluation of the associated costs $\{C_k\}$, as in System A, the detector selects the m vectors $\{P_k\}$ with the smallest costs, regardless of the values of any of their $\{x_i\}$. Following the expansion of the latter vectors into 4 m vectors $\{P_k\}$ and the evaluation of their costs $\{|U_k|^2\}$, again as in System A, the detector selects the vector $P_k$ with the smallest cost and takes the detected data-symbol $s_{k-n}'$ to have the value of $x_{k-n}$ in the selected vector $P_k$. All vectors $\{P_k\}$ for which $x_{k-n} \neq s_{k-n}'$ are now discarded, and the detection process proceeds as in System B.

SYSTEM D

This is an alternative approach to that in System C towards reducing the amount of storage and the number of operations involved in a detection process of System B. On the receipt of $r_k'$ the detector expands each of the m vectors $\{Q_{k-1}\}$ into the corresponding four vectors $\{P_k\}$, where $x_k$ has the four values $\pm 1$ and $\pm 3$, and the detector evaluates $c_k$ (eqn. 11) for each of the 4 m vectors $\{P_k\}$. The detector also expands each vector $Q_{k-1}$ into four vectors $\{P_k\}$, where $x_k$ has the four values $\pm j$ and $\pm 3j$ ($j=\sqrt{-1}$), and again evaluates $c_k$ for each vector $P_k$. The detector then discards from each group of four vectors $\{P_k\}$ (originating from a single vector $Q_{k-1}$ via either of the two expansion processes) the vector $P_k$ with the largest cost $c_k$, leaving three vectors in each group. Bearing in mind that $y_o = 1$, this can be done very simply without in fact evaluating $c_k$ for any vector $P_k$, but using just the real and imaginary parts of the quantity $$d_k = r_k' - \sum_{h=0}^{n} x_{k-h} y_h \quad (16)$$

in eqn. 11. Thus, from the values of $d_k$ for the six vectors $\{P_k\}$, in the two groups of three vectors originating from any single vector $Q_{k-1}$, the resulting values of $d_k$ for the nine vectors $\{P_k\}$, given by all combinations of the three real and three imaginary values of $x_k$ in the six vectors, are very easily evaluated, to give the corresponding costs $\{|U_k|^2\}$ of the nine vectors, computed according to eqn. 12. $x_k$ is, of course, complex valued in each of these vectors. The detector now has 9 m vectors $\{P_k\}$ together with the associated costs. The detector then determines $s_{k-n}'$ from the value of $x_{k-n}$ in the vector $P_k$ with the smallest cost, and the detection process proceeds exactly as for System B.

SYSTEM E

This is a simple modification of System D in which each of the m stored vectors $\{Q_{k-1}\}$ is expanded into four vectors $\{P_k\}$, where $x_k$ has the four values $\pm 1$ and $\pm 3$, and also into four vectors $\{P_k\}$, where $x_k$ has the four values $\pm j$ and $\pm 3j$, exactly as before, but now the detector selects from each group of four vectors $\{P_k\}$ the two vectors with the smallest costs $\{c_k\}$, the basic method of selection being that described for System D. From the four vectors $\{P_k\}$ derived from any single vector $Q_{k-1}$, $X_k$ being real-valued in two of these and imaginary-valued in the other two, the detector forms the four vectors $\{P_k\}$ having the complex-valued $\{x_k\}$ given by all combinations of the real and imaginary values of $x_k$ in the original four vectors, and evaluates the associated costs $\{|U_k|^2\}$. The detector now has 4 m vectors $\{P_k\}$ together with the associated costs, and proceeds with the detection of $s_{k-n}$ and the selection of m vectors $\{Q_k\}$ exactly as for System B.

SYSTEM F

This is a simple modification of System E which operates exactly as does System E except that the detector derives only three (rather than four) vectors $\{P_k\}$ with complex values for $x_k$, from any single vector $Q_{k-1}$, the vectors $\{P_k\}$ being those with the smallest costs $\{|U_k|^2\}$ in the corresponding group of four vectors of System E. Again, the selection process for the $\{P_k\}$ can be implemented very simply, without in fact evaluating the costs, which are determined after the selection process. Thus the detector generates 3 m vectors $\{P_k\}$ together with the associated costs $\{|U_k|^2\}$, and then proceeds with the detection of $s_{k-n}$ and the selection of m vectors $\{Q_k\}$, exactly as for System B.

COMPUTER SIMULATION TESTS

The tolerance to additive white Gaussian noise of the six systems A–F and of a conventional nonlinear (decision-feedback) equalizer have been determined by computer simulation over models of four different telephone circuits, using the arrangements shown in FIGS. 1 and 2 and described in with reference to examples A through F. In every case (including that of the equalizer) it is assumed that the adaptive linear filter has an appropriately large number of taps and is accurately adjusted to perform the ideal linear transformation described in Sections 1 and 2.

Figure 7A:
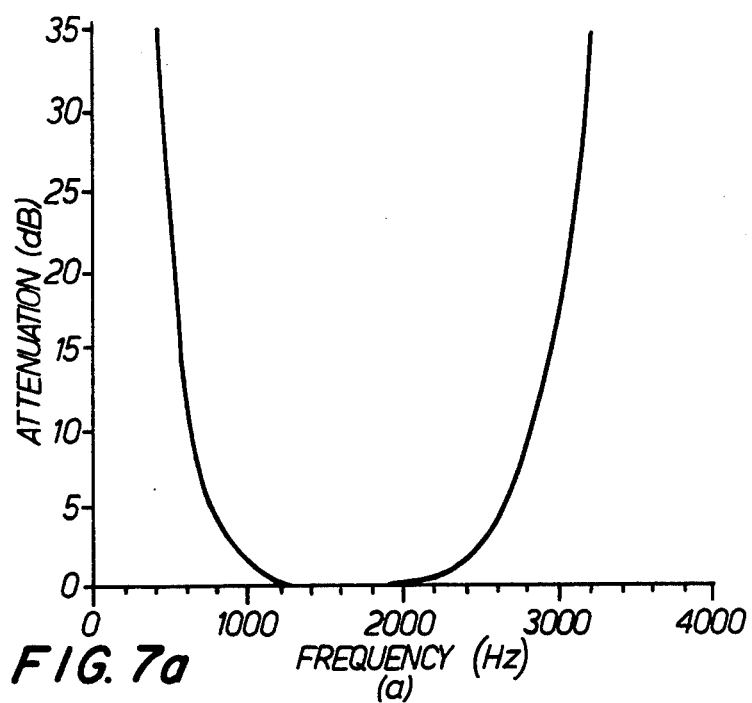
FIG. 7a shows attenuation characteristic and FIG. 7b shows Group-delay characteristic of the combination of transmitter and receiver filters.
Figure 7B:
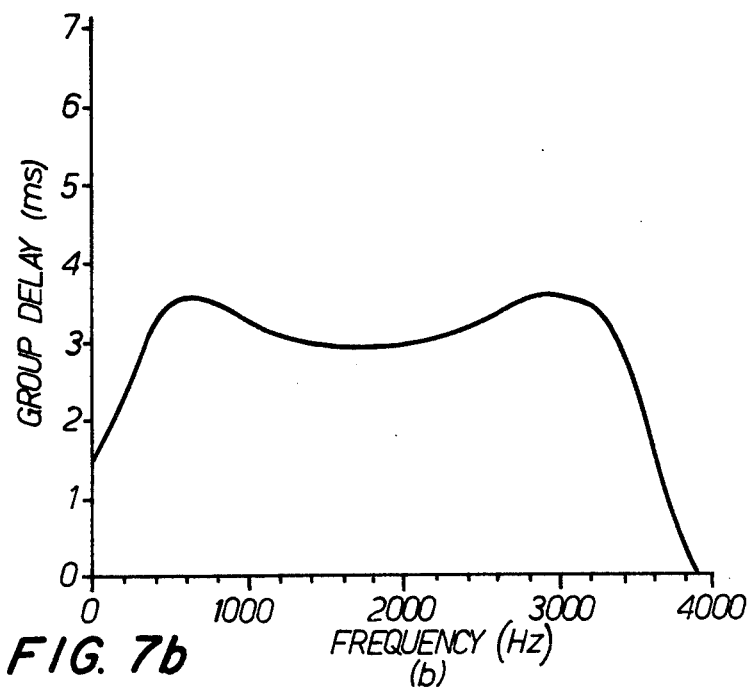
Figure 8:
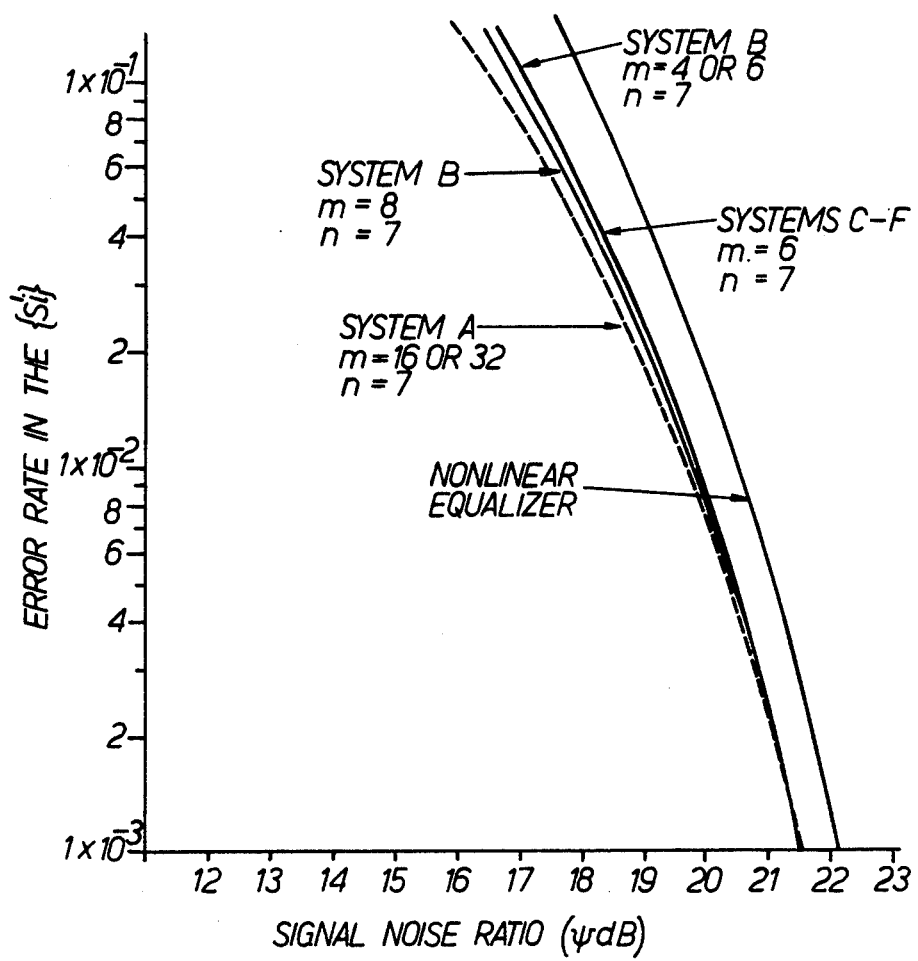
FIG. 8 shows variation of error rate with signal/noise ratio for the different systems operating over the telephone-circuit 1.
Figure 9:
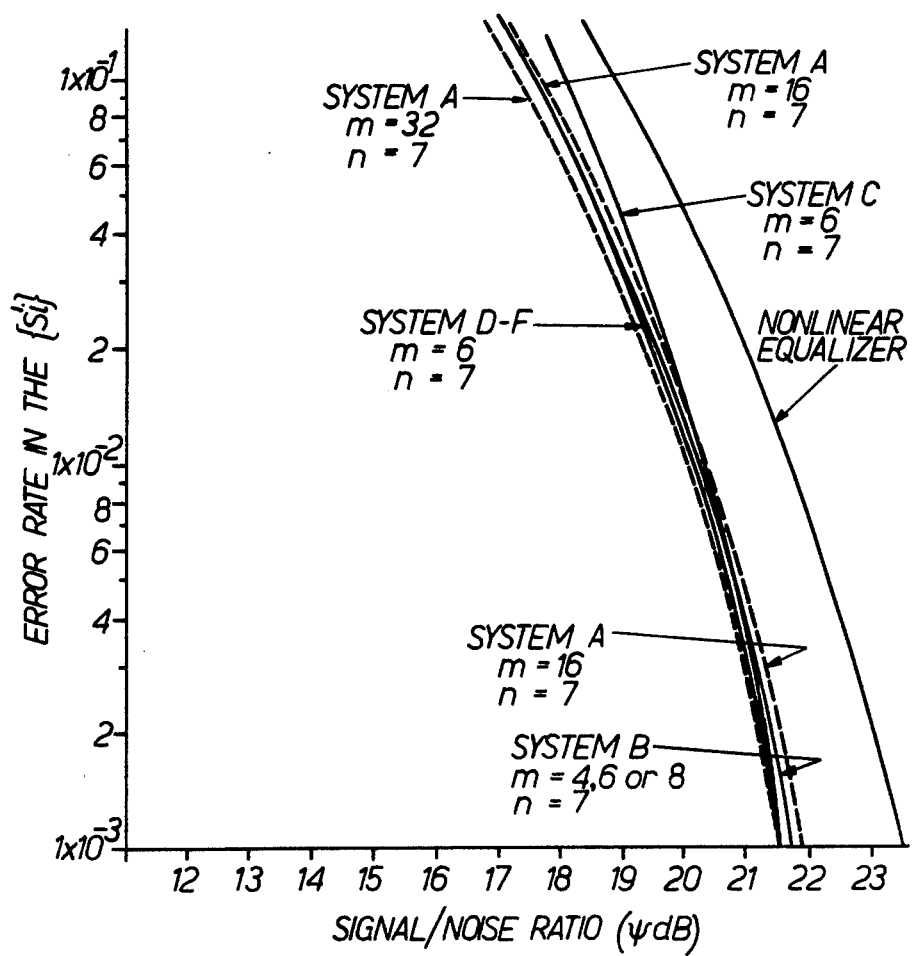
FIG. 9 shows variation of error rate with signal/noise ratio for the different systems operating over the telephone-circuit 2.
Figure 10:
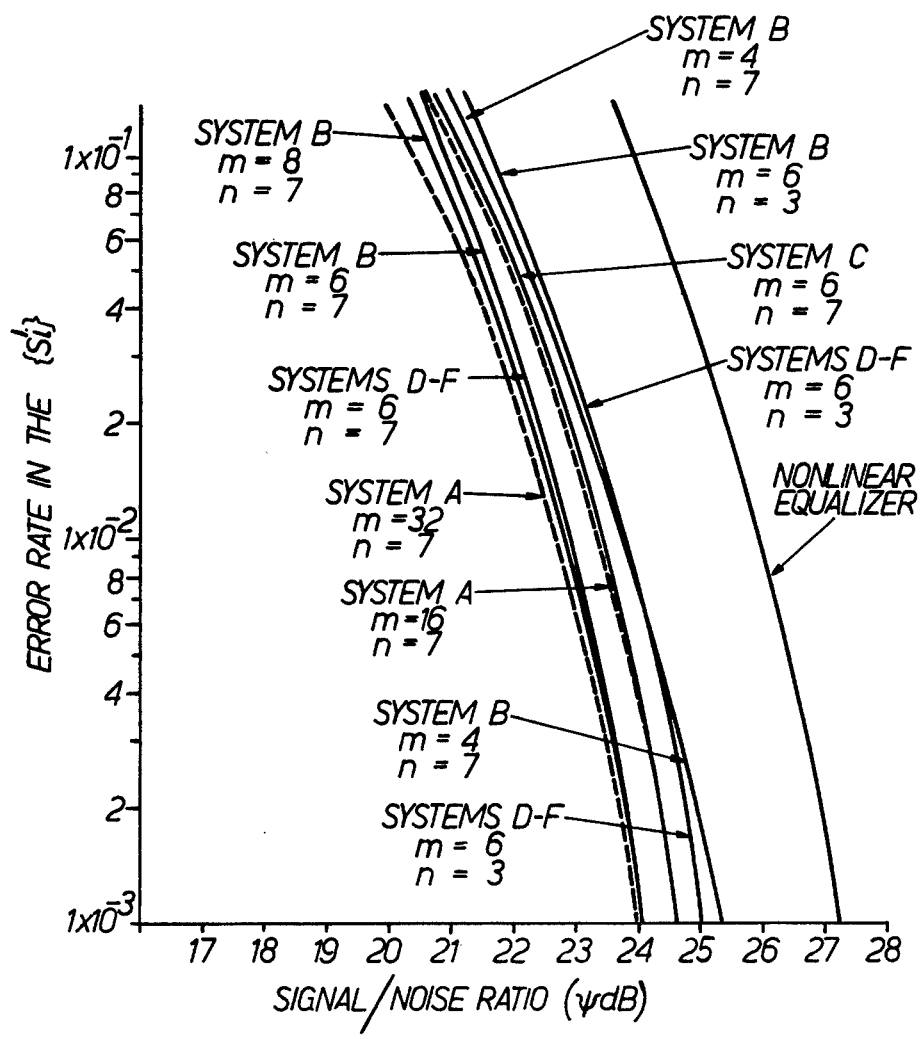
FIG. 10 shows variation of error rate with signal/noise ratio for the different systems operating over the telephone-circuit 3.
Figure 11:
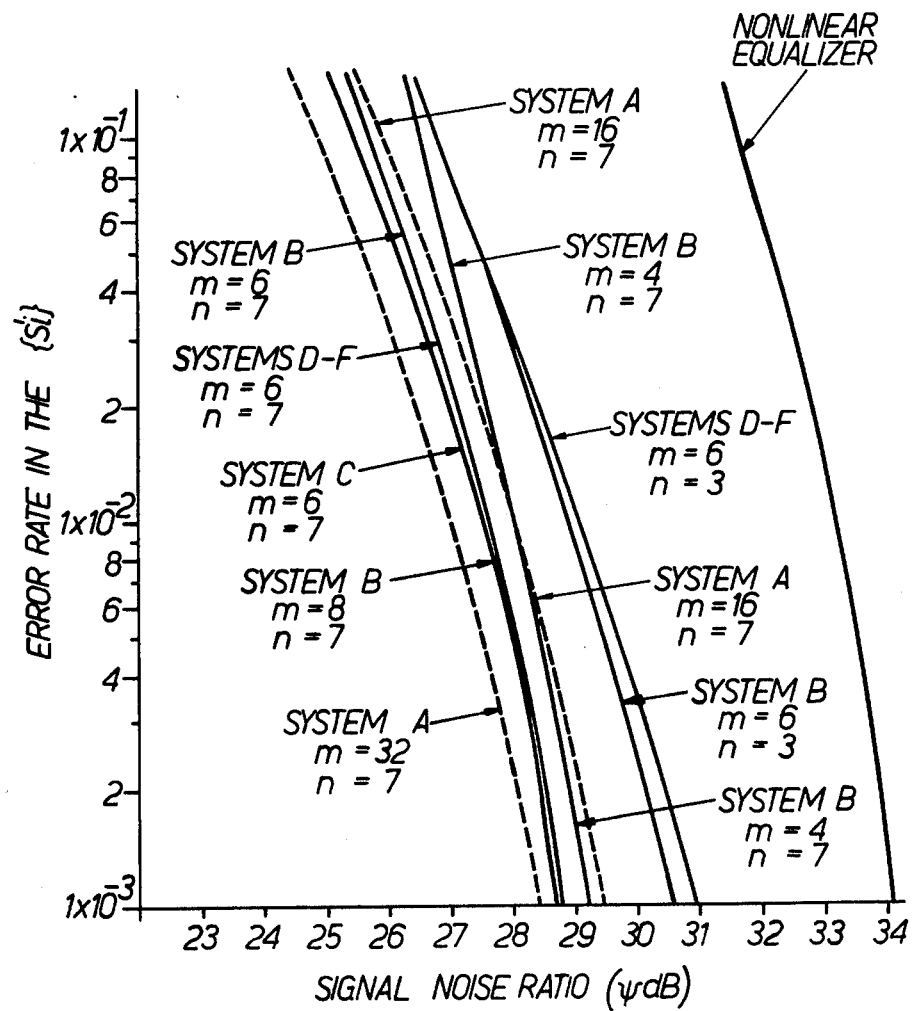
FIG. 11 shows variation of error rate with signal/noise ratio for the different systems operating over the telephone-circuit 4.

FIGS. 3–6 show the attenuation and group-delay characteristics of the four different telephone circuits used in the tests, the telephone circuit forming a part of the transmission path in FIG. 1. FIG. 7 shows the resultant attenuation and group-delay characteristics of the equipment filters, these being here considered as operating on the transmitted bandpass signal, rather than on the baseband signals in the transmitter and receiver as shown in FIG. 1, to demonstrate more clearly the effects of the equipment filters in limiting some of the distortion introduced by the telephone circuit. The equipment filters are taken to include the filtering required to convert the sequence of impulses at the transmitter input (FIG. 1) into the corresponding rectangular waveform used in an actual modem.

Table 1 shows the sampled impulse-response of the linear baseband channel, sampler and adaptive linear filter in FIG. 1, for each of the four different telephone circuits tested. This gives some idea of the resultant distortion introduced by each channel, bearing in mind that the ideal sampled impulse-response has the first component equal to unity and the remainder all zero. It can be seen from FIGS. 3 and 7 that nearly all the signal distortion shown in Table 1 for the telephone circuit 1 is in fact introduced by the equipment filters. The telephone circuits 1 and 2 introduce negligible and typical levels of distortion, respectively, whereas the circuits 3 and 4 are close to the typical worst circuits normally considered for the transmission of data at 9600 and 600–1200 bits/second, respectively. The telephone circuit 3, which is close to the Post Office network N6, introduces severe group-delay distortion, and the telephone circuit 4, which is close to the Post Office network N3, introduces very severe attenuation distortion.

FIGS. 8–11 show the performances of Systems A–F and of a conventional nonlinear equalizer, for the telephone circuits 1–4. The signal/noise ratio is here taken to be $\psi$ dB, where $$\psi = 10 \log_{10}(10/2\sigma^2) \qquad (17)$$

bearing in mind that the mean-square value of the data-symbol $s_i$ is 10 and $2\sigma^2$ is the variance of the Gaussian noise component $w_i$. The 95% confidence limits of the curves is better than $\pm\frac{1}{2}$ dB. System A has been tested with both $m=16$ and 32 and with $n=7$, where m is the number of stored vectors $\{Q_k\}$ and n is the number of components in $Q_k$. Systems B–F have all been tested with $m=6$ and with both $n=3$ and 7. For the telephone circuits 3 and 4, System B has in addition been tested with both $m=4$ and 8 and with $n=7$.

It can be seen from FIGS. 8–11 that the Systems A–F all have a much better overall tolerance to additive white Gaussian noise than the conventional nonlinear equalizer. The System A with $m=32$ (32 stored vectors) and $n=7$ (a delay in detection of 7 sampling intervals) has the best performance of all systems tested, as would perhaps be expected, but when $m=16$ and $n=7$ its tolerance to noise at the lower error rates in the $\{s_i'\}$ becomes inferior to that of the Systems B–F, with $m=6$ and $n=7$. The latter arrangements all have a similar tolerance to noise at the lower error rates, this being significantly better than that with $m=6$ and $n=3$, over the telephone circuits 3 and 4. No very useful advantage in the tolerance to noise of the Systems B–F seems likely to be achieved by increasing m to a value greater than 6, but when m is reduced from 6 to 4 there is a noticeable degradation in performance. At error rates around 1 in $10^3$, the Systems B–F, with $m=6$ and $n=7$, have an advantage in tolerance to additive white Gaussian noise, over the nonlinear equalizer, of approximately $\frac{1}{2}$, $1\frac{1}{2}$, 3 and $5\frac{1}{2}$ dB, for the telephone circuits 1, 2, 3 and 4, respectively.

FIG. 12 shows the effects on the error rate in the $\{s_i'\}$ of inaccuracies in the estimates made by the receiver of the level and carrier phase of the received signal, when System E with $m=6$ and $n=7$ operates over the telephone circuits 1–4. It can be seen that, over the telephone circuit 3, the system can tolerate an inaccuracy of about $\frac{1}{4}$ dB in the estimate of the received signal level or else an inaccuracy of about 2 degrees in the estimate of the received signal carrier phase, for an increase of two times in the error rate of the $\{s_i'\}$, this representing a reduction of less than $\frac{1}{2}$ dB in tolerance to additive white Gaussian noise. It seems likely therefore that in a well designed modem and with the correction of the more serious phase jitter in the received signal carrier, no very serious degradation in tolerance to additive noise should be experienced due to the inaccurate estimation of the received signal level or carrier phase.

Of the various arrangements tested, Systems E and F with $m=6$ and $n=7$ appear to be the most cost-effective. They promise to give a substantial improvement in tolerance to additive noise over the conventional nonlinear equalizer, without involving a great increase in equipment complexity. Bearing in mind that the telephone circuit 4 is basically similar to the typical worst telephone circuit likely to be experienced over the switched telephone network in this country, it seems that so long as the accurate convergence of the adaptive linear filter can be achieved and appropriate steps are taken in the design of the modem to combat the effects of carrier-phase jitter, correct operation of the system should be obtained over nearly all circuits on the public switched telephone network.

1 Clark, A. P., "Principles of Digital Data Transmission" (Pentech Press, London, 1976).
2 Monsen, P., "Feedback equalization of fading dispersive channels", IEEE Trans. on Information Theory, IT-17, pp.56–64, January 1971.
3 Westcott, R. J., "An experimental adaptively equalized modem for data transmission over the switched telephone network", The Radio and Electronic Engineer, 42, pp.499–507, November 1972.
4 Clark, A. P. and Tint, U. S., "Linear and non-linear transversal equalizers for baseband channels", The Radio and Electronic Engineer, 45, pp.271–283, June 1975.
5 Clark, A. P., "Advanced Data-Transmission Systems" (Pentech Press, London, 1977).
6 Forney, G. D., "Maximum-likelihood sequence estimation of digital sequences in the presence of intersymbol interference", IEEE Trans., IT-18, pp.363–378, May 1972.
7 Forney, G. D., "The Viterbi-algorithm, Proc. IEEE, 61, pp.268–278, March 1973.
8 Qureshi, S. U. H. and Newhall, E. E., "An adaptive receiver for data transmission over time-dispersive channels", IEEE Trans., IT-19, pp.448–457, July 1973.
9 Falconer, D. D. and Magee, F. R., "Adaptive channel memory truncation for maximum-likelihood sequence estimation", Bell Syst. Tech. J., 52, pp.1541–1562, November 1973.
10 Cantoni, A. and Kwong, K., "Further results on the Viterbi-algorithm equalizer", IEEE Trans., IT-20, pp.764–767, November 1974.
11 Desbalche, A. E., "Optimal short desired impulse response for maximum-likelihood sequence estimation", IEEE Trans. on Communications, COM-25, pp.735–738, July 1977.
12 Foschini, G. J., "A reduced state variant of maximum-likelihood sequence detection attaining optimum performance for high signal-to-noise ratios", IEEE Trans., IT-23, pp.605–609, September 1977.
13 Clark, A. P., Harvey, J. D. and Driscoll, J. P., "Near-maximum-likelihood detection processes for distorted digital signals", The Radio and Electronic Engineer, 48, pp.301–309, June 1978.
14 Clark, A. P., Kwong, C. P. and Harvey, J. D., "Detection processes for severely distorted digital signals", Electronic Circuits and Systems, 3, pp.27–37, January 1979.
15 Magee, F. R. and Proakis, J. G., "Adaptive maximum-likelihood sequence estimation for digital signalling in the presence of intersymbol interference", IEEE Trans., IT-19, pp.120–124, January 1973.
16 Clark, A. P., Kwong, C. P. and McVerry, F., "Estimation of the sampled impulse-response of a channel", Signal Processing, 2, pp.39–53, January 1980.
17 Clark, A. P. and Harvey, J. D., "Detection of distorted q.a.m. signals", Electronic Circuits and Systems, 1, pp.103–109. April 1977.

TABLE 1

Sampled impulse-response of baseband channel and adaptive linear filter in FIG. 1, for each of the four telephone circuits.

| TELEPHONE CIRCUIT 1 | | TELEPHONE CIRCUIT 2 | | TELEPHONE CIRCUIT 3 | | TELEPHONE CIRCUIT 4 | |
|---|---|---|---|---|---|---|---|
| REAL PART | IMAGINARY PART | REAL PART | IMAGINARY PART | REAL PART | IMAGINARY PART | REAL PART | IMAGINARY PART |
| 1.0000 | 0.0000 | 1.0000 | 0.0000 | 1.0000 | 0.0000 | 1.0000 | 0.0000 |
| 0.3412 | 0.0667 | 0.5091 | 0.1960 | 0.4861 | 1.0988 | 0.2544 | 1.9941 |
| −0.1298 | −0.0358 | −0.1465 | 0.0000 | −0.5980 | 0.0703 | −1.7394 | −0.2019 |
| 0.0263 | 0.0051 | 0.0323 | −0.0171 | 0.1702 | −0.1938 | 0.6795 | −0.8086 |
| 0.0015 | 0.0008 | 0.0125 | 0.0200 | −0.0245 | 0.1000 | 0.0408 | 0.5113 |
| −0.0019 | −0.0016 | −0.0099 | −0.0109 | 0.0100 | −0.0258 | −0.1189 | −0.1463 |
| −0.0017 | 0.0006 | 0.0046 | 0.0074 | −0.0134 | 0.0110 | 0.0343 | 0.0420 |
| −0.0011 | −0.0004 | −0.0069 | −0.0083 | 0.0056 | −0.0042 | −0.0185 | −0.0364 |
| 0.0018 | 0.0010 | 0.0059 | 0.0076 | 0.0003 | 0.0003 | 0.0139 | 0.0216 |
| −0.0014 | 0.0000 | −0.0025 | −0.0053 | −0.0008 | 0.0041 | −0.0102 | −0.0009 |
| −0.0008 | −0.0004 | −0.0013 | 0.0040 | 0.0000 | −0.0061 | −0.0019 | −0.0034 |
| 0.0016 | −0.0001 | 0.0024 | −0.0028 | 0.0007 | −0.0007 | 0.0037 | −0.0046 |
| −0.0006 | 0.0001 | −0.0009 | 0.0018 | 0.0037 | 0.0002 | −0.0028 | −0.0006 |
| −0.0006 | 0.0003 | −0.0006 | −0.0006 | −0.0019 | −0.0025 | −0.0019 | −0.0046 |
| 0.0005 | −0.0001 | 0.0001 | −0.0003 | 0.0020 | 0.0008 | 0.0083 | 0.0022 |
| 0.0000 | 0.0004 | 0.0002 | 0.0008 | 0.0005 | −0.0002 | −0.0056 | 0.0059 |
| 0.0002 | −0.0003 | 0.0000 | −0.0006 | −0.0022 | 0.0002 | −0.0046 | −0.0028 |
| −0.0004 | 0.0000 | −0.0003 | −0.0001 | 0.0007 | −0.0005 | 0.0049 | −0.0019 |
| −0.0001 | 0.0002 | −0.0002 | 0.0003 | −0.0008 | 0.0002 | −0.0009 | 0.0037 |
| 0.0004 | −0.0001 | 0.0003 | −0.0002 | 0.0005 | 0.0005 | −0.0009 | 0.0003 |
| 0.0000 | 0.0000 | 0.0000 | 0.0000 | 0.0000 | 0.0000 | 0.0000 | 0.0000 |
| 0.0000 | 0.0000 | 0.0000 | 0.0000 | 0.0000 | 0.0000 | 0.0000 | 0.0000 |

What we claim is:

1. A method of detecting a multi-level input signal using a Viterbi algorithm, in which the incoming signal has m levels, said method comprising the steps of sampling the incoming signal at regular predetermined intervals thereby to generate signal samples, expanding each signal sample of the received signal into nk expanded vectors where n is smaller than m, from the nk expanded vectors having a respective cost associated therewith, selecting k vectors with the smallest costs, storing said selected k vectors together with their associated costs, and calculating the most likely level of the received signal on the basis of said costs.

2. A method of detecting a multi-level input signal as claimed in claim 1 in which the expansion process is performed sequentially in two operations and in which $n = m^{\frac{1}{2}}$, k vectors being chosen after each expansion process.

3. A method of detecting a multi-level input signal as claimed in claim 1 wherein the expansion process is performed simultaneously in two operations and in which $n \leq m^{\frac{1}{2}}$ such that the two sets of nk expanded vectors give a total of $n^2k$ vectors from which are selected the k vectors to be stored.

4. An apparatus for decoding a multi-level data signal employing a Viterbi algorithm wherein the data signal has m levels, said apparatus comprising:
receiving means for receiving said data signal,
sampling means for sampling the received data signal at regular predetermined intervals thereby to generate a plurality of signal samples,
expanding means for expanding each signal sample of the received data signal into nk expanded vectors wherein n is smaller than m,
cost generating means for generating a cost associated with each of said selected k vectors,
selecting means for selecting k vectors from said nk expanded vectors which have the smallest cost,
storing means for storing said selected k vectors together with a respective cost associated with each of said k vectors, and
calculating means for calculating the most likely level of said received data signal on the basis of said cost.

5. An apparatus according to claim 4 wherein said expanding means comprises means for sequentially expanding each sample in two sequential operations in which $n = m^{\frac{1}{2}}$, and means for selecting k vectors having expanding each said sample of received data signal.

6. An apparatus as recited in claim 4 wherein said expanding means comprises means for expanding each sample of the received data signal in two simultaneous operations in which n is less than or equal to the square root of m such that the two sets of nk expanded vectors render a total of $n^2k$ vectors from which k vectors are selected and stored.

* * * * *